United States Patent
Yamaguchi et al.

(10) Patent No.: US 6,292,928 B1
(45) Date of Patent: Sep. 18, 2001

(54) LINE PATH DETERMINING METHOD AND DELAY ESTIMATING METHOD

(75) Inventors: Ryuichi Yamaguchi, Osaka; Keiichi Kurokawa, Hyogo, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/227,858

(22) Filed: Jan. 11, 1999

(30) Foreign Application Priority Data

Jan. 13, 1998 (JP) .................................................. 10-004381

(51) Int. Cl.⁷ ...................................................... G06F 17/50
(52) U.S. Cl. .................................... 716/13; 716/6; 716/10
(58) Field of Search ............................................. 716/1–21

(56) References Cited

U.S. PATENT DOCUMENTS

| | | | |
|---|---|---|---|
| 5,402,357 | 3/1995 | Schaefer et al. | 716/12 |
| 5,461,576 | 10/1995 | Tsay et al. | 716/6 |
| 5,629,860 | * 5/1997 | Jones et al. | 716/6 |
| 5,774,371 | * 6/1998 | Kawakami | 716/10 |
| 5,798,936 | * 8/1998 | Cheng | 716/13 |
| 5,917,729 | * 6/1999 | Naganuma et al. | 716/10 |
| 5,943,486 | * 8/1999 | Fukui et al. | 716/9 |
| 5,984,510 | * 11/1999 | Guruswamy et al. | 716/2 |
| 5,987,086 | * 11/1999 | Raman et al. | 716/1 |

FOREIGN PATENT DOCUMENTS

| | | |
|---|---|---|
| 05143692 | 11/1993 | (JP) . |
| 06120343 | 4/1994 | (JP) . |

OTHER PUBLICATIONS

Shew et al. ("Efficient algorithms for two and three-layer over-the-cell channel routing", 1994 IEEE International Symposium on Circuits and Systems, vol. 4, pp. 183–186), May 1994.*

(List continued on next page.)

*Primary Examiner*—Matthew Smith
*Assistant Examiner*—Phallaka Kik
(74) *Attorney, Agent, or Firm*—McDermott, Will & Emery (57) ABSTRACT

A line capacitance is estimated in consideration of an influence of an adjacent line in rough routing, so that line paths can be determined so as to be free from a timing error. A routing graph is generated from a target integrated circuit, and line paths of cell-to-cell lines are initially determined on the basis of a passage cost set with regard to each of edges of the routing graph. With regard to each edge of the routing graph, the number of cell-to-cell lines passing through the edge is obtained as a line density, and a line capacitance of each line path in view of the influence of an adjacent line is estimated on the basis of the line density. It is verified whether or not there is a timing error with a delay time estimated, and when the integrated circuit does not satisfy a predetermined timing constraint, the line paths are re-determined with the passage cost of each edge allowed to be affected by the line capacitance. Alternatively, allocation to an interconnect layer is changed or a line-to-line distance is increased, so that the integrated circuit can satisfy the timing constraint.

6 Claims, 7 Drawing Sheets

OTHER PUBLICATIONS

Pal et al. ("Resolving horizontal constraints and minimizing net wire length for multi–layer channel routing", Proceedings of 1993 IEEE Region 10 Conference on Computer, Communication, Control and Power Engineering TENCON '93, vol. 1, pp. 569–573), Oct. 1993.*

Watanabe et al. ("A congestion–cost–directed router for VLSI switchboxes", IEEE International Symposium on Circuits and Systems, 1990, vol. 3, pp. 1684–1687), May 1990.*

Cong et al. ("A new algorithm for standard cell global routing", IEEE International Conference on Computer–Aided Design, 1988, ICCAD–88, Digest of Technical Papers, pp. 176–179), Nov. 1988.*

Lin et al. ("Edge embedding of two–dimensional grids in hypercubes dilation two and congestion three", Proceedings of the 1996 International Conference on Parallel Processing, 1996, vol. 2, pp. 62–69), Aug. 1996.*

Li et al. ("MCM routing algorithm based on a compatibility graph approach", Electronics Letters, vol. 32, No. 1, pp. 5–6), Jan. 1996.*

Chen et al. ("A graph theoretic approach to feed–through pin assignment", 1995 IEEE International Symposium on Circuits and Systems, ISCAS '95, vol. 3, pp. 1687–1690), Apr. 1995.*

Shew et al. ("Efficient height reduction over–the–cell channel router", IEE Proceedings—Computer and Digital Techniques, vol. 142, No. 4, pp. 293–298) Jul. 1995.*

Hossain et al. ("Optimal algorithms for restricted single row routing problems", Proceedings of the 34th Midwest Symposium on Circuits and Systems, vol. 2, pp. 823–826), May 1991.*

* cited by examiner

| LINE-TO-LINE DISTANCE | LINE CAPACITANCE |
|---|---|
| d1 | c1 |
| d2 | c2 |
| d3 | c3 |
| d4 | c4 |

LINE PATH DETERMINING METHOD AND DELAY ESTIMATING METHOD

BACKGROUND OF THE INVENTION

The present invention relates to a layout design technique for integrated circuits, and more particularly, it relates to methods of determining a line path and estimating delay in rough routing of semi-custom LSIs such as an ASIC.

In the recent manufacturing technique for semiconductor integrated circuits, transistors and lines have been more and more refined. In accordance with the refinement, the delay time of a transistor itself tends to be decreased. However, since the capacitance between adjacent lines is increased due to the refinement of the lines, the output load capacitance of a cell cannot be always decreased, and hence, the proportion of delay depending upon the line capacitance is relatively increased in the delay of the entire integrated circuit.

Accordingly, in order to guarantee an operation timing, the recent layout design for an integrated circuit requires a method of precisely estimating a line capacitance in consideration of an adjacent line and definitely determining a line path that satisfies a timing constraint.

Conventional methods of determining a line path include the following:

As a first conventional method, after a routing pattern is generated on the basis of detailed routing for determining lines in detail, an adjacent routing pattern is searched for with regard to each line so as to calculate a line capacitance generated between the adjacent lines (Japanese Laid-Open Patent Publication No. 6-120343).

As a second conventional method, in a rough routing procedure, a delay time of each line is estimated on the basis of a virtual line length and a line capacitance attained when the line is assumed to be allocated to an interconnect layer having the maximum line capacitance per unit length (hereinafter referred to as the "unit capacitance"), so as to extract a net against a timing constraint, and this net is allocated to another interconnect layer for satisfying the timing constraint (Japanese Laid-Open Patent Publication No. 5-143692).

However, the conventional methods of determining a line path have the following problems:

In the first conventional method, since a line capacitance is calculated in consideration of the influence of an adjacent line after completely generating the routing pattern in detail on the basis of the detailed routing, when there is a timing error, it is very difficult to remove the timing error by modifying the routing. Specifically, the amount of data to be dealt with for modifying the routing is so large that the process takes a long period of time, and in some cases, the calculating process cannot be converged and the routing cannot be modified.

Alternatively, in the second conventional method, since a line is assumed to be allocated to an interconnect layer with the maximum unit capacitance in the net against the timing constraint, the line capacitance is likely to be excessively estimated. Also, since an adjacent line is not considered in the estimation of the line capacitance, even when no timing error is caused in the rough routing process, a timing error can be occasionally caused due to an adjacent line after detailed routing. Accordingly, a netlist itself should be changed for the modification for eliminating the timing error.

SUMMARY OF THE INVENTION

The object of the invention is providing a line path determining method in which line paths can be determined in rough routing with a timing error eliminated through estimation of a line capacitance in consideration of the influence of adjacent lines.

In order to achieve this object, according to this invention, paying attention to estimation of probability of existence of adjacent lines on the basis of a line density in rough routing, delay is calculated through estimation of a line capacitance based on the estimated existence probability of the adjacent lines, and a line path in a net against a timing constraint is determined based on the obtained delay.

Specifically, the line path determining method of this invention for determining line paths between cells placed in an integrated circuit designed at a cell level comprises a rough routing step of dividing a routing area of the integrated circuit into plural partial areas, generating a routing graph in which a cell terminal belonging to each of the partial areas is represented by one node and adjacent nodes are connected through edges, and initially determining, on the routing graph, line paths of cell-to-cell lines on the basis of a passage cost set with regard to each of the edges; a line density estimating step of obtaining, as a line density of each of the edges of the routing graph, the number of cell-to-cell lines passing through each edge; and a line capacitance estimating step of obtaining, with regard to each of the edges of the routing graph, a line-to-line distance on the basis of the line density obtained in the line density estimating step, obtaining a line capacitance on the basis of the line-to-line distance, and estimating a line capacitance of each of the line paths initially determined in the rough routing step, on the basis of the line capacitance of each edge, as a sum of line capacitances of edges included in each line path, wherein a delay time of each of the line paths is estimated on the basis of the line capacitance of each line path estimated in the line capacitance estimating step, and line paths are determined on the basis of the estimated delay time so as to make the integrated circuit satisfy a predetermined timing constraint.

In this method, with regard to the routing graph generated from a target integrated circuit in the rough routing step, the number of cell-to-cell lines passing through each edge is obtained as the line density in the line density estimating step. Then, in the line capacitance estimating step, the line-to-line distance is obtained from the line density of each edge, and the line capacitance is obtained from the line-to-line distance. As a result, the line capacitance of each line path initially determined in the rough routing step is estimated. On the basis of this line capacitance, delay of each line path is estimated, and on the basis of the estimated delay, line paths are determined so as to make the integrated circuit satisfy the predetermined timing constraint. Accordingly, the line paths can be determined with a timing error eliminated on the basis of the result of the path search in the rough routing through estimation of the line capacitance in consideration of the influence of the adjacent lines by using the line density. Therefore, timing errors can be predicted and avoided to some extent in the path search in the rough routing, and hence, layout modification which can be accompanied with large modification of the routing pattern if conducted after the detailed routing can be largely reduced.

In the line path determining method, when the integrated circuit does not satisfy the predetermined timing constraint, the method preferably further comprises a rough re-routing step of adding, as a parameter of the passage cost set with regard to each of the edges, the line capacitance of each edge obtained in the line capacitance estimating step, and re-determining, on the routing graph, line paths of the cell-to-cell lines on the basis of the passage cost set with regard to each of the edges.

In this manner, since an alternate path with a smaller line capacitance is searched for, in the rough re-routing step, with regard to a line path causing a timing error, a timing error can be efficiently avoided.

Furthermore, in the line path determining method, in the routing graph, plural edges respectively corresponding to interconnect layers available for routing c an be set between adjacent nodes, and when the integrated circuit does not satisfy the predetermined timing constraint, the method can further comprise a n interconnect layer changing step of changing a edge included in a line path not satisfying the timing constraint to a edge connecting the same nodes and corresponding to an interconnect layer with a smaller unit capacitance.

In this manner, since an interconnect layer with a smaller unit capacitance is allocated, in the interconnect layer changing step, to a line path causing a timing error, a timing error can be efficiently avoided.

Moreover, in the line path determining method, when the integrated circuit does not satisfy the predetermined timing constraint, the method can further comprise a line-to-line distance enlarging step of setting a distance between a line included in a line path not satisfying the timing constraint and an adjacent line to be larger than a distance between other lines.

In this manner, since a line-to-line distance between a line path causing a timing error and an adjacent line is set, in the line-to-line distance enlarging step, to be longer than a distance between the other lines so as to decrease the line capacitance, a timing error can be efficiently avoided.

Alternatively, the method of this invention of estimating delay of lines between cells placed in an integrated circuit designed at a cell level comprises a rough routing step of dividing a routing area of the integrated circuit into plural partial areas, generating a routing graph in which a cell terminal belonging to each of the partial areas is represented by one node and adjacent nodes are connected through edges, and determining, on the routing graph, line paths of cell-to-cell lines on the basis of a passage cost set with regard to each of the edges; a line density estimating step of obtaining, as a line density of each of the edges of the routing graph, the number of cell-to-cell lines passing through each edge; and a line capacitance estimating step of obtaining, with regard to each of the edges of the routing graph, a line-to-line distance on the basis of the line density obtained in the line density estimating step, obtaining a line capacitance on the basis of the line-to-line distance, and estimating a line capacitance of each of the line paths determined in the rough routing step, on the basis of the line capacitance of each edge, as a sum of line capacitances of edges included in each line path, wherein delay of the integrated circuit is estimated on the basis of the line capacitance of each line path estimated in the line capacitance estimating step.

In this method, on the routing graph generated from a target integrated circuit in the rough routing step, the number of cell-to-cell lines passing through each edge is obtained as a line density in the line density estimating step. Then, in the line capacitance estimating step, a line-to-line distance is obtained based on the line density of each edge, and on the basis of the line-to-line distance, a line capacitance is obtained, so as to estimate a line capacitance of each line path initially determined in the rough routing step. Since delay of the integrated circuit is estimated on the basis of the thus obtained line capacitance, delay can be estimated on the basis of the result of the path search in the rough routing through estimation of the line capacitance in consideration of the influence of the adjacent lines by using the line density.

Furthermore, in the delay estimating method, in the routing graph, plural edges respectively corresponding to interconnect layers available for routing can be set between adjacent nodes.

DETAILED DESCRIPTION OF THE INVENTION

An embodiment of the invention will now be described with reference to the accompanying drawings.

Figure 1:
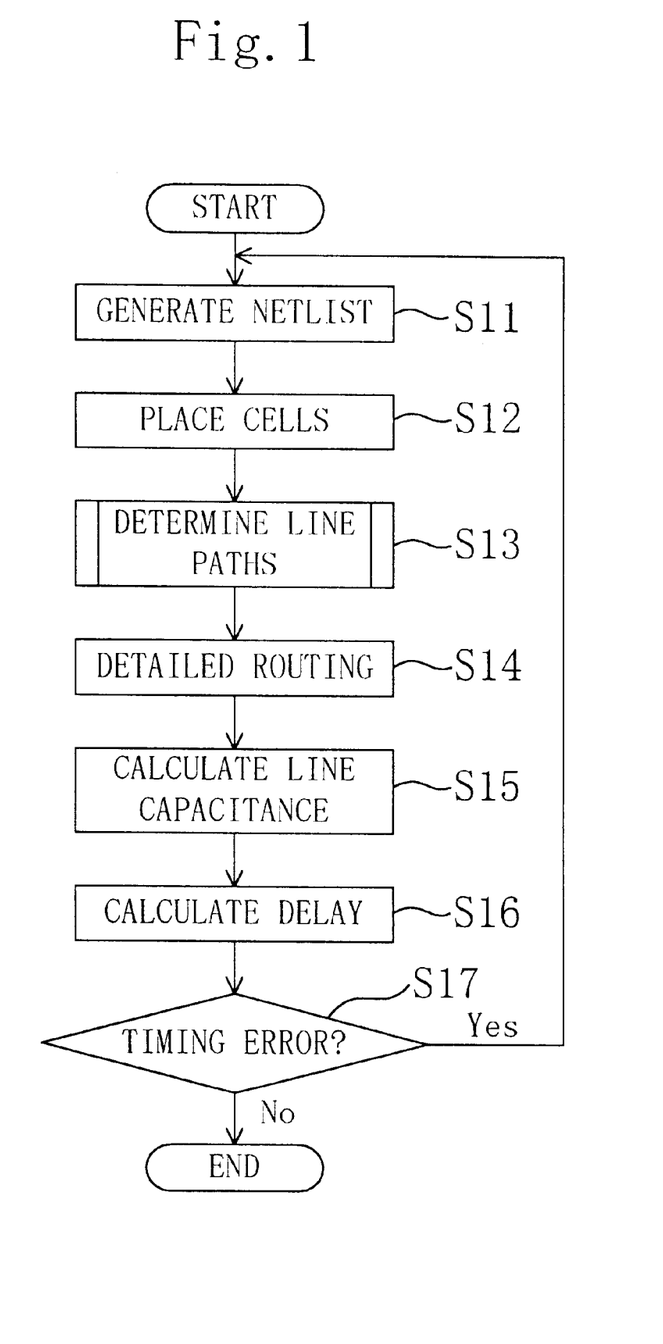
FIG. 1 is a flowchart for showing procedures in layout design for an integrated circuit.

FIG. 1 is a flowchart for showing procedures in layout design for an integrated circuit. In FIG. 1, S11 indicates a netlist making step of making a netlist describing connection between respective cells in a target integrated circuit; S12 indicates a cell placing step of placing each cell described in the netlist made in the netlist making step S11; S13 indicates a line path determining step of determining line paths between the cells placed in the cell placing step S12; S14 indicates a detailed routing step of generating a routing pattern through detailed routing; S15 indicates a line capacitance calculating step of calculating a capacitance between lines on the basis of the routing pattern generated in the detailed routing step S14; and S16 indicates a delay time calculating step of calculating a delay time of the integrated circuit. Also, S17 indicates a step of verifying whether or not there is a timing error, and when it is determined in the step S17 that there is a timing error, the procedure returns to the netlist making step S11, where the layout is redesigned from the beginning.

In a line path determining method according to an embodiment of the invention, the line path determining step S13 in the layout design for an integrated circuit shown in FIG. 1 is executed.

Figure 2:
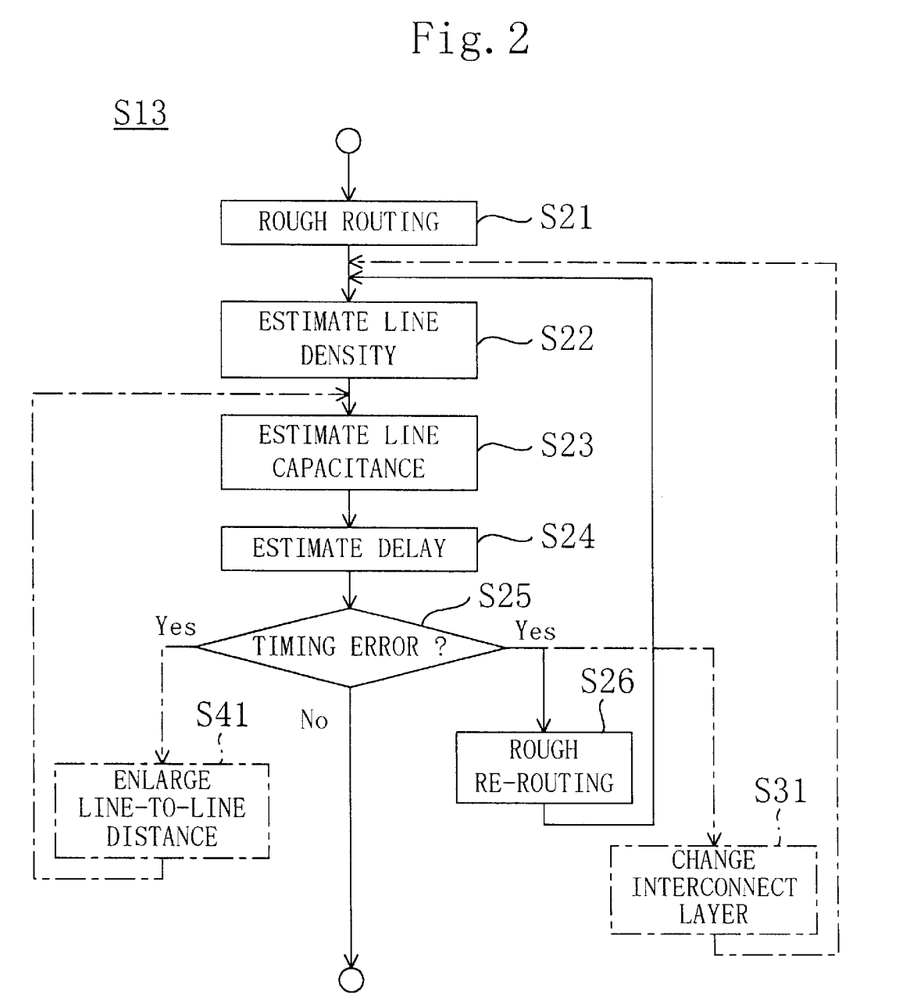
FIG. 2 is a flowchart for showing a line path determining step S13 in the layout design for an integrated circuit of FIG. 1, namely, a line path determining method according to an embodiment of the invention.

FIG. 2 is a flowchart for showing procedures in the line path determining step S13 in the layout design for an integrated circuit of FIG. 1, which corresponds to the line path determining method of this embodiment. In FIG. 2, S21 indicates a rough routing step of searching and initially determining line paths of cell-to-cell lines; S22 indicates a line density estimating step of estimating a line density; S23 indicates a line capacitance estimating step of obtaining a line capacitance of each line path on the basis of the line density estimated in the step S22; S24 indicates a delay estimating step of estimating a delay time of each line path; S25 indicates a step of verifying whether or not there is a timing error; and S26 indicates a rough re-routing step of re-determining a line path of a cell-to-cell line when it is determined in the step S25 that there is a line path not satisfying a predetermined timing constraint. An interconnect layer changing step S31 and a line-to-line distance enlarging step S41 shown with dashed lines in FIG. 2 will be described later.

When the procedures excluding the rough routing step S21 are omitted in the line path determining step S13 of FIG. 2, the process accords with that of the conventional layout design for an integrated circuit. Also, the rough routing step S21, the line density estimating step S22, the line capacitance estimating step S23 and the delay estimating step S24 together correspond to a delay estimating method according to this embodiment.

The line path determining method and the delay estimating method according to this embodiment will now be specifically described in connection with the entire layout design for an integrated circuit.

First, in the netlist making step S11, a netlist for describing connection between cells including logical device elements is made with regard to a target integrated circuit designed at a cell level. Next, in the cell placing step S12, the cells included in the netlist made in the netlist making step S11 are placed on the layout, so as to generate a layout diagram.

Then, the line path determining step S13 is executed on the layout diagram generated in the cell placing step S12.

Figure 3:
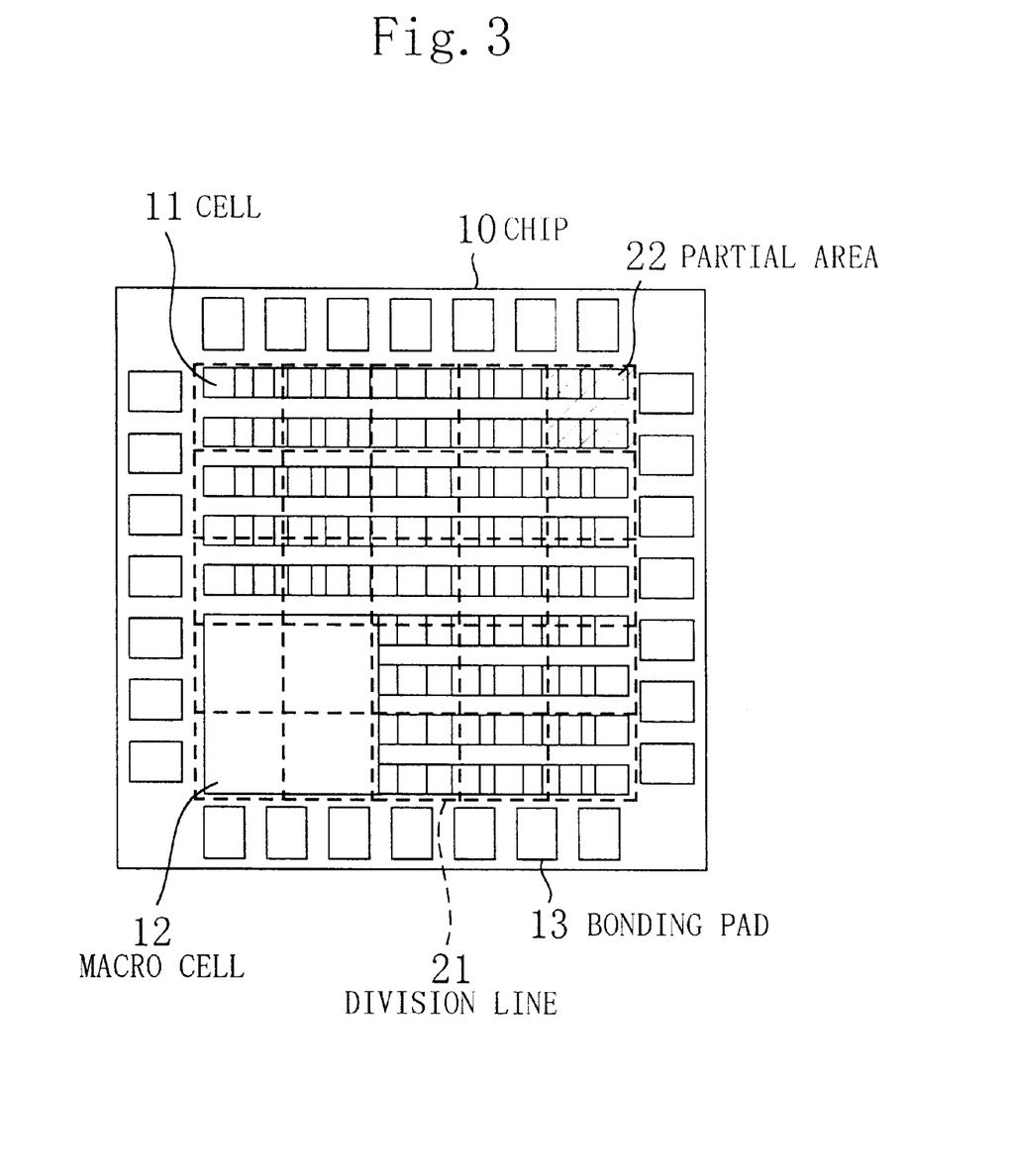
FIG. 3 is a diagram resulting from dividing a routing area into partial areas in a layout diagram of an integrated circuit.
Figure 4:
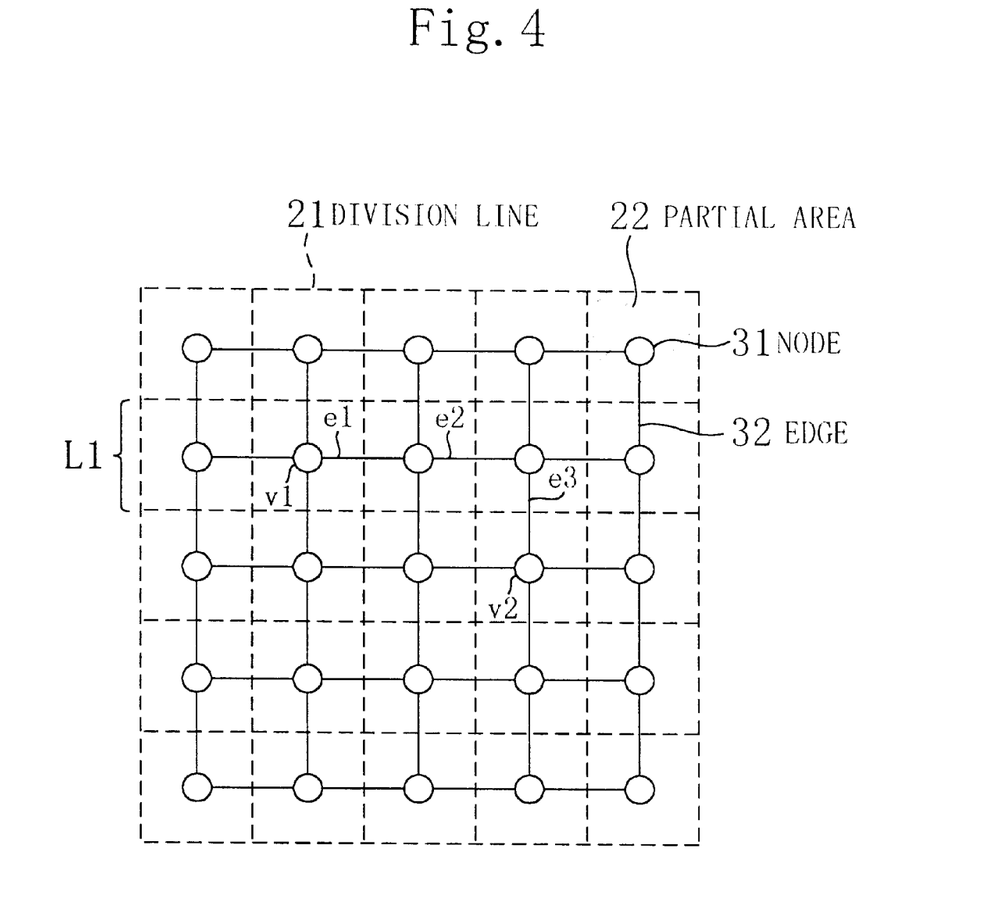
FIG. 4 is a routing graph generated on the basis of the layout diagram of FIG. 3.

First, in the rough routing step S21, a routing graph is generated on the basis of the layout diagram generated in the cell placing step S12. FIG. 3 shows an example of the layout diagram of the target integrated circuit, wherein a reference numeral 10 denotes a chip, a reference numeral 11 denotes a cell, a reference numeral 12 denotes a macro cell, and a reference numeral 13 denotes a bonding pad. In the layout diagram of FIG. 3, a routing area is divided into plural partial areas 22 with division lines 21. Then, a routing graph as is shown in FIG. 4 is generated, in which each partial area 22 is represented by a node 31 and adjacent nodes 31 are connected with a edge 32. In the routing graph as is shown in FIG. 4, each node 31 represents a cell terminal belonging to the corresponding partial area 22, and paths of lines connecting the respective cell terminals, namely, cell-to-cell line paths, are represented by a combination of edges 32.

Each edge 32 is provided with a passage cost using a line length, a line direction and the number of passing lines as parameters. The line path of each cell-to-cell line is initially determined so that the sum of the passage costs of the edges 32 included in the line path can be minimized. In this embodiment, each edge 32 is provided with a passage cost, for example, represented by the following expression:

Passage cost=(Line length)×(Line direction coefficient)+(Number of passing lines)

In this expression, the "line length" is given as a length determined on the basis of the longitudinal and latitudinal dimensions of the partial areas 22 which a edge extends over. Also, since the line path is allocated to a different interconnect layer depending upon the routing direction, the "line direction coefficient" is used as a coefficient for allowing the passage cost to be influenced by a difference in the unit capacitance of each interconnect layer depending upon the routing direction. For example, when a unit capacitance of an interconnect layer for the vertical line is 1.2 times as large as a unit capacitance of an interconnect layer for the horizontal line, 1.0 is set as the coefficient in the passage cost of a edge 32 in the horizontal direction and 1.2 is set as the coefficient in the passage cost of a edge 32 in the vertical direction. In the case where plural interconnect layers are available In each direction, the "line direction coefficient" is set on the basis of the average of unit capacitances of the respective interconnect layers. Furthermore, the "number of passing lines" is given as the number of lines passing through each edge 32 obtained as a result of the line path search.

In FIG. 4, a line path for connecting a node v1 and a node v2 is initially determined as a combination of, for example, edges e1, e2 and e3, so as to minimize the sum of the passage costs.

In the line density estimating step S22, on the basis of the line paths initially determined in the rough routing step S21, the number of cell-to-cell lines passing through each edge 32 is obtained as the line density of the edge 32. Then, in the line capacitance estimating step S23, with regard to each edge of the routing graph, an average distance from adjacent lines is obtained on the basis of the line density estimated in the line density estimating step S22 and the dimension of each partial area 22. Thus, a line capacitance of each line path is estimated.

Figure 5:
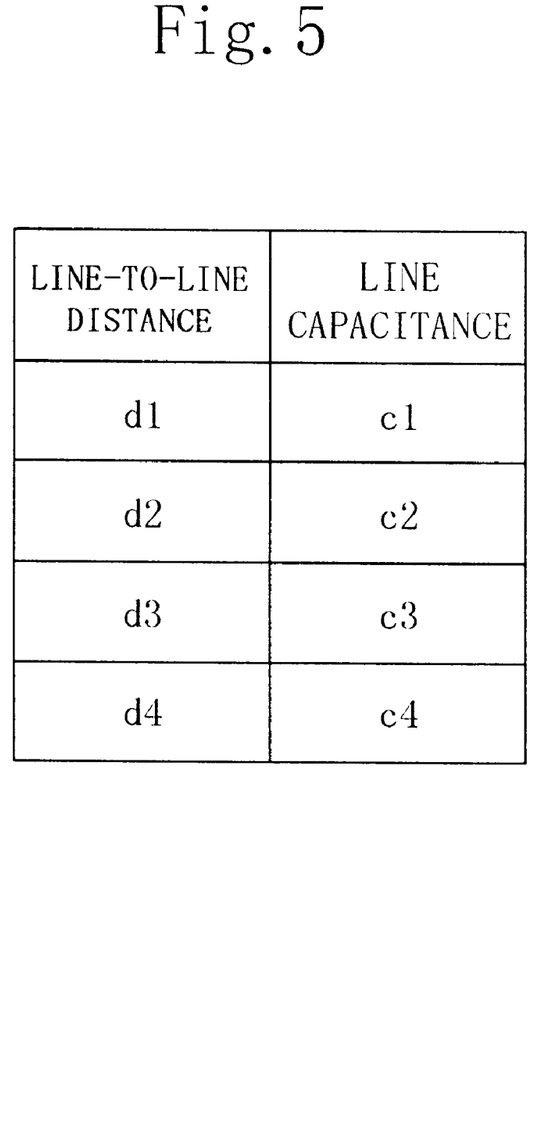
FIG. 5 is a table for showing the relationship between a distance between lines and a line capacitance.

In exemplifying the edge e1 representing a horizontal line in the routing graph of FIG. 4, when the line density of the edge e1 is assumed to be n1 and the longitudinal dimension of the partial area relating to the edge e1 is assumed to be L1, the average distance from an adjacent line of the edge e1 is L1/n1. On the basis of the average distances between the lines thus obtained, a line capacitance of each edge 32 is set by using the relationship between the line-to-line distance and the line capacitance previously stored as a table as is shown in FIG. 5. Then, the line capacitance of each line path is estimated as a sum of the line capacitances set with regard to the respective edges 32 included in the line path. For example, the line capacitance of the line path between the nodes v1 and v2 including the edges e1, e2 and e3 is estimated as the sum of the line capacitances of the edges e1, e2 and e3.

By using the line capacitance of each line path estimated in the line capacitance estimating step S23, delay is calculated in the delay estimating step S24, and it is verified whether or not there is a timing error in the step S25. When it is determined in the step S25 that there is a timing error, the rough re-routing step S26 of re-determining a line path is executed.

In the rough re-routing step S26, a line path of the cell-to-cell line is determined on the routing graph on the basis of the passage costs set with regard to the respective edges in the same manner as in the aforementioned rough routing step S21. However, in the rough re-routing step S26, the line path is determined with the line capacitance of each edge obtained in the line capacitance estimating step S23 used as an additional parameter of the passage cost. In this manner, a line path which can minimize the line capacitance can be selected through the path search.

When a new line path is determined in the rough re-routing step S26, the procedure returns to the line density estimating step S22, so that the procedures in the steps S22 through S26 can be repeatedly executed until there is no timing error. When the line paths free from a timing error are determined, the line path determining step S13 is completed.

Thereafter, referring to FIG. 1 again, a routing pattern is generated through detailed routing in the detailed routing step S14, the line capacitances are calculated on the basis of the routing pattern in the line capacitance calculating step S15, and the delay is calculated in the delay calculating step S16. Then, in the step S17, it is verified whether or not there is a timing error. When a timing error is found in this step, the procedure returns to the netlist making step S11 so as to modify the original netlist as in the conventional technique. However, in this embodiment, since the line paths are searched for in consideration of the line capacitances in the rough routing in the line path determining step S13, the number of timing errors possibly found at this point can be largely decreased as compared with that in the conventional technique.

As described above, in this embodiment, the line paths are determined so as to be free from a timing error with the line capacitances estimated in view of the influence of the adjacent lines in the line capacitance estimating step S23 by using the line density obtained in the line density estimating step S22 on the basis of the result of the line path search in the rough routing step S21. Accordingly, the occurrence of timing errors can be predicted and avoided to some extent in the path search in the rough routing, and hence, layout modification which can be accompanied with large modification of the routing pattern if conducted after the detailed routing can be largely reduced.

Furthermore, since an alternate path with a smaller line capacitance is searched for, in the rough re-routing step S26, with regard to a line path causing a timing error, a timing error can be efficiently avoided.

(Interconnect layer changing step S31)

Moreover, plural edges 32 respectively corresponding to available interconnect layers can be provided between adjacent nodes in a routing graph.

Figure 6:
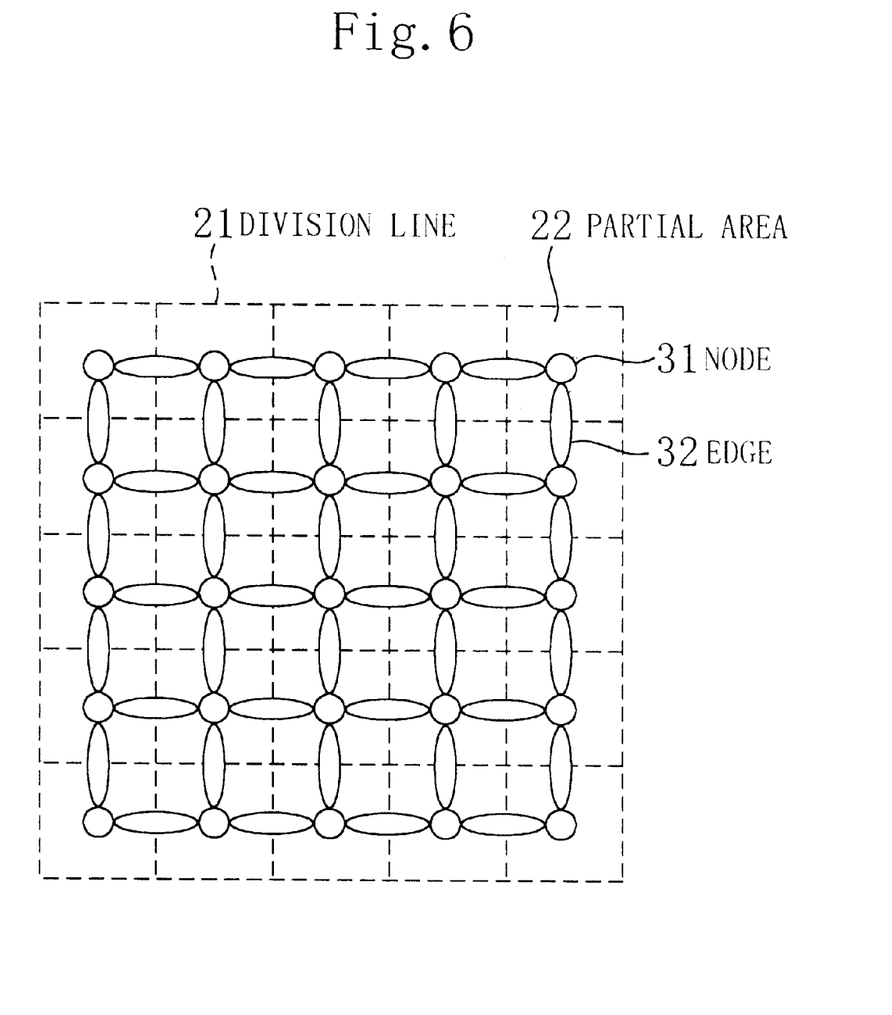
FIG. 6 shows another example of the routing graph.

FIG. 6 is a diagram for showing another example of the routing graph generated in the rough routing step S21. The routing graph of FIG. 6 is different from that of FIG. 4 in the plural edges 32 for connecting the respective nodes 31 being provided correspondingly to interconnect layers available for routing. The routing graph of FIG. 6 premises four-layer routing, and it is assumed that the numbers of interconnect layers for the vertical lines and the horizontal lines are two, respectively.

A passage cost using a line length, an interconnect layer and the number of passing lines as parameters is set with regard to each edge 32. For example, the passage cost represented by the following expression is set with regard to each edge 32:

Passage cost=(Line length)×(Unit capacitance of interconnect layer)+(Number of passing lines)

In this expression, the "line length" is given as a length determined on the basis of the longitudinal and latitudinal dimensions of partial areas 22 which a edge extends over. Also, the "unit capacitance of an interconnect layer" is given as a unit capacitance of an interconnect layer corresponding to each edge 32. Furthermore, the "number of passing lines" is given as the number of lines passing through each edge 32 obtained as a result of the line path search. Thus, the path search results in finding line paths each with a minimized passage cost.

When it is determined in the step S25 that there is a timing error, the interconnect layer changing step S31 is executed so that a edge included in a line path not satisfying the timing constraint can be changed to another edge connecting the same nodes and corresponding to an interconnect layer with a smaller unit capacitance. In this manner, a global line path including an interconnect layer with a smaller line capacitance can be selected, and hence, a timing error can be efficiently avoided.

It is noted that the interconnect layer changing step S31 can be executed in stead of the rough re-routing step S26 as is shown in FIG. 2 or can be executed in addition to the rough re-routing step S26. Alternatively, for example, when it is determined in the step S25 that there is a timing error, the interconnect layer changing step S31 can be first executed, and when the timing error cannot be thus removed, the global re-routing step S26 can be executed.

(Line-to-line distance enlarging step S41)

Moreover, when it is determined in the step S25 that there is a timing error, the line-to-line distance enlarging step S41 can be executed so that a distance between a line path not satisfying the predetermined timing constraint and an adjacent line can be set to be longer than a distance between the other lines.

Figure 7:
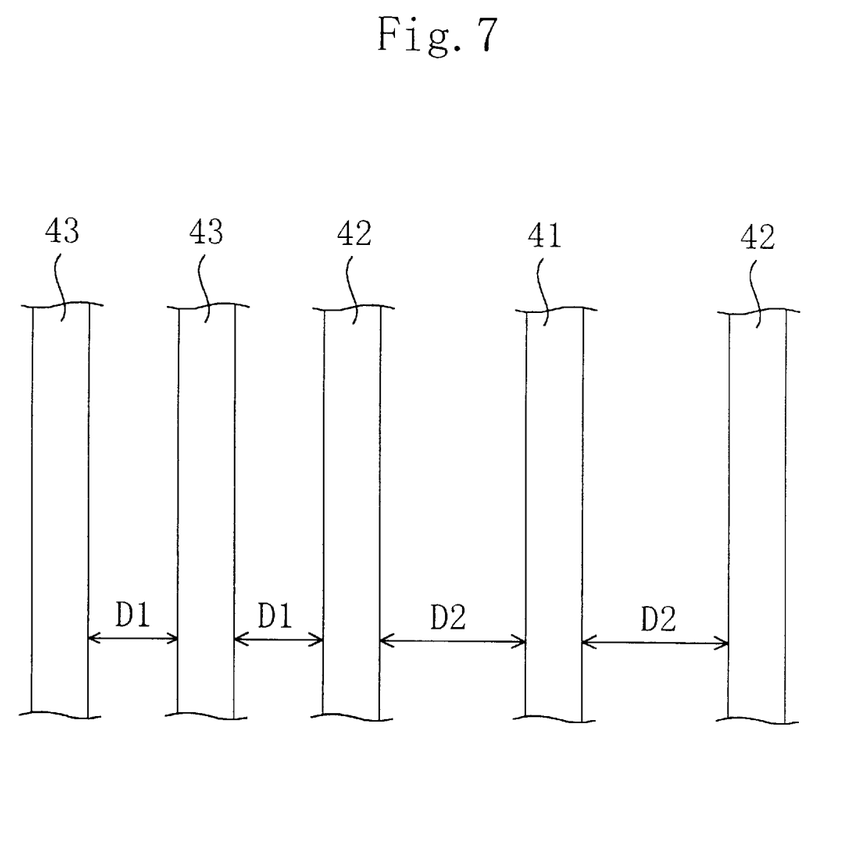
FIG. 7 is a diagram for showing enlargement of a distance between lines.

Specifically, in the line-to-line distance enlarging step S41, a distance between a line 41 of the line path not satisfying the timing constraint and an adjacent line 42 is changed to a distance D2, which is larger than a distance D1 between normal lines 42 and 43, as is shown in FIG. 7.

In the delay estimating step S24, the delay time of the line path not satisfying the timing constraint is calculated on the basis of the relationship between the line-to-line distance and the line capacitance shown in FIG. 5 by using a line capacitance estimated in accordance with the line-to-line distance changed in the line-to-line distance enlarging step S41.

In the detailed routing step S14, the detailed routing is executed in accordance with the line-to-line distance changed in the line-to-line distance enlarging step S41, thereby generating a routing pattern. Since the distance from the adjacent lines is thus increased, the line capacitance of this line can be decreased, resulting in removing the timing error.

In this manner, since the distance between the line path causing a timing error and the adjacent lines is set to be longer than the line-to-line distance between the other lines so as to decrease the line capacitance in the line-to-line distance enlarging step S41, a timing error can be efficiently avoided.

Also the line-to-line distance enlarging step S41 can be executed in stead of the rough re-routing step S26 as is shown in FIG. 2 or can be executed in addition to the rough re-routing step S26 similar to the interconnect layer changing step S31. Alternatively, for example, when it is determined in the step S25 that there is a timing error, the line-to-line distance enlarging step S41 can be first executed, and when the timing error cannot be thus removed, the rough re-routing step S26 can be executed.

As described so far, according to this invention, a line path is determined so as to be free from a timing error through estimation of a line capacitance in consideration of the influence of adjacent lines by using a line density on the basis of the result of path search in the rough routing. Accordingly, timing errors can be predicted and avoided to some extent in the path search in the rough routing, and hence, the layout modification which can be accompanied with large modification of the routing pattern if conducted after the detailed routing can be largely reduced.

In addition, with regard to a line path causing a timing error, an alternate path with a smaller line capacitance is searched for, an interconnect layer with a smaller unit capacitance is allocated to, or a distance from an adjacent line is set to be longer than a distance between the other lines. In this manner, a timing error can be efficiently avoided.

What is claimed is:

1. A method for determining line paths between cells placed in an integrated circuit designed at a cell level, comprising:

a rough routing step of dividing a routing area of said integrated circuit into plural partial areas, generating a routing graph in which a cell terminal belonging to each of said partial areas is represented by one node and adjacent nodes are connected through edges, and initially determining, on said routing graph, line paths of cell-to-cell lines on the basis of a passage cost set with regard to each of said edges;

a line density estimating step of obtaining, as a line density of each of said edges of said routing graph, the number of cell-to-cell lines passing through said each edge; and a line capacitance estimating step of obtaining, with regard to each of said edges of said routing graph, a line-to-line distance on the basis of said line density obtained in said line density estimating step, obtaining a line capacitance on the basis of said line-to-line distance, and estimating a line capacitance of each of said line paths initially determined in said rough routing step, on the basis of said line capacitance of each edge, as a sum of line capacitances of edges included in said each line path, wherein a delay time of each of said line paths is estimated on the basis of said line capacitance of said each line path estimated in said line capacitance estimating step, and line paths are determined on the basis of said estimated delay time so as to make said integrated circuit satisfy a predetermined timing constraint.

2. The line path determining method of claim 1, wherein, when said integrated circuit does not satisfy said predetermined timing constraint, the method further comprises a rough re-routing step of adding, as a parameter of said passage cost set with regard to each of said edges, said line capacitance of said each edge obtained in said line capacitance estimating step, and re-determining, on said routing graph, line paths of the cell-to-cell lines on the basis of said passage cost set with regard to each of said edges.

3. The line path determining method of claim 1, wherein, in said routing graph, plural edges respectively corresponding to interconnect layers available for routing are set between adjacent nodes, and when said integrated circuit does not satisfy said predetermined timing constraint, the method further comprises an interconnect layer changing step of changing an edge included in a line path not satisfying said timing constraint for an edge connecting the same nodes and corresponding to an interconnect layer with a smaller unit capacitance.

4. The line path determining method of claim 1, wherein, when said integrated circuit does not satisfy said predetermined timing constraint, the method further comprises a line-to-line distance enlarging step of setting a distance between a line included in a line path not satisfying said timing constraint and an adjacent line to be larger than a distance between other lines.

5. A method of estimating delay of lines between cells placed in an integrated circuit designed at a cell level, comprising:

a rough routing step of dividing a routing area of said integrated circuit into plural partial areas, generating a routing graph in which a cell terminal belonging to each of said partial areas is represented by one node and adjacent nodes are connected through edges, and determining, on said routing graph, line paths of cell-to-cell lines on the basis of a passage cost set with regard to each of said edges;

a line density estimating step of obtaining, as a line density of each of said edges of said routing graph, the number of cell-to-cell lines passing through said each edge; and a line capacitance estimating step of obtaining, with regard to each of said edges of said routing graph, a line-to-line distance on the basis of said line density obtained in said line density estimating step, obtaining a line capacitance on the basis of said line-to-line distance, and estimating a line capacitance of each of said line paths determined in said rough routing step, on the basis of said line capacitance of each edge, as a sum of line capacitances of edges included in said each line path, wherein delay of said integrated circuit is estimated on the basis of said line capacitance of said each line path estimated in said line capacitance estimating step.

6. The delay estimating method of claim 5, wherein, in said routing graph, plural edges respectively corresponding to interconnect layers available for routing are set between adjacent nodes.

* * * * *